United States Patent [19]

Marshall

[11] Patent Number: 4,953,577
[45] Date of Patent: Sep. 4, 1990

[54] SPRAY ENCAPSULATION OF PHOTOVOLTAIC MODULES

[75] Inventor: Jack Marshall, Glenolden, Pa.

[73] Assignee: Solarex Corporation, Rockville, Md.

[21] Appl. No.: 375,954

[22] Filed: Jul. 6, 1989

[51] Int. Cl.⁵ .......................................... H01L 31/048
[52] U.S. Cl. ....................................... 136/251; 437/2; 437/211
[58] Field of Search ...................... 437/2.5, 64, 67, 205, 437/207, 211, 235; 427/74–76, 387, 421; 136/251, 259; 357/72

[56] References Cited

U.S. PATENT DOCUMENTS

| | | | |
|---|---|---|---|
| 4,064,521 | 12/1977 | Carlson | 357/2 |
| 4,217,148 | 8/1980 | Carlson | 136/255 |
| 4,292,092 | 9/1981 | Hanak | 437/2 |
| 4,317,844 | 3/1982 | Carlson | 427/39 |
| 4,331,494 | 5/1982 | Duchateau et al. | 156/87 |
| 4,383,129 | 5/1983 | Gupta et al. | 136/251 |
| 4,426,240 | 1/1984 | Louis et al. | 156/99 |
| 4,499,658 | 2/1985 | Lewis | 437/2 |
| 4,542,257 | 9/1985 | Fraser et al. | 136/251 |
| 4,544,797 | 10/1985 | Hewig | 136/249 TJ |
| 4,549,033 | 10/1985 | Avenel et al. | 136/251 |
| 4,568,409 | 2/1986 | Caplan | 156/643 |
| 4,592,925 | 6/1986 | DuPont et al. | 427/74 |
| 4,597,161 | 7/1986 | Yamazaki | 437/2 |
| 4,636,578 | 1/1987 | Feinberg | 136/251 |
| 4,692,557 | 9/1987 | Samuelson et al. | 136/251 |
| 4,709,119 | 11/1987 | Worner | 136/260 |
| 4,710,397 | 12/1987 | Yamazaki | 427/53.1 |
| 4,721,629 | 1/1988 | Sakai et al. | 427/35 |
| 4,773,944 | 9/1988 | Nath et al. | 136/249 TJ |
| 4,830,038 | 5/1989 | Anderson et al. | 136/251 |
| 4,860,509 | 8/1989 | Laaly et al. | 52/173 R |

FOREIGN PATENT DOCUMENTS

| | | | |
|---|---|---|---|
| 59-198773 | 11/1984 | Japan | 136/251 |
| 59-198776 | 11/1984 | Japan | 136/251 |
| 63-9159 | 1/1988 | Japan | 136/251 |

OTHER PUBLICATIONS

"A Guide to Dow Corning Silane Coupling Agents", pp. 1–31, Dow Corning Corp., Midland, Mich.
"66/3 CPU–Series Surface Treatments" (3/80) by KRC Research Corp., Moorestown, N.J.
American Chemical Society's Symposium Series, Polymeric Materials for Corrosion Control, Matienzo et al., "Organic Corrosion Inhibitors to Improve the Durability of Adhesion Between Aluminum and Polymer Coatings", (1986).

Primary Examiner—Aaron Weisstuch
Attorney, Agent, or Firm—Finnegan, Henderson, Farabow, Garrett and Dunner

[57] ABSTRACT

A method for encapsulating a photovoltaic module and an encapsulated photovoltaic module. The photovoltaic module includes a superstrate and one or more photovoltaic cells disposed on the superstrate. A barrier coating is applied to the exposed side of the photovoltaic module. The barrier coating is a mixture of a two component fluorinated polyurethane with 3-glycidoxy propyltrimethoxy silane. The photovoltaic module may also include an isolation scribe located around the perimeter of the exposed surface of the module.

14 Claims, 4 Drawing Sheets

SPRAY ENCAPSULATION OF PHOTOVOLTAIC MODULES

Background of the Invention

The present invention relates to encapsulants for photovoltaic modules and, more particularly, to spray encapsulants for photovoltaic modules and also relates to a photovoltaic module having a wide isolation scribe.

Photovoltaic modules include a superstrate of, for example, glass upon which one or more photovoltaic cells are fabricated. The photovoltaic cells are connected in series and a solder pad is conventionally provided at either end of the series of photovoltaic cells to which power leads can be attached.

While the superstrate protects one side of the photovoltaic cells from potentially harmful ambient conditions during use, the other side is exposed to ambient conditions and must, therefore, be covered to protect it. Such a protective cover of the exposed side of photovoltaic cells is commonly referred to as an "encapsulant" or a "barrier coating".

In addition to encapsulants or barrier coatings, photovoltaic modules can also be protected by isolation scribes, which are rectangular grooves located around the perimeter of photovoltaic modules to protect the module from contaminants.

Known encapsulants exist in a variety of forms such as a rigid glass panel laminated to the photovoltaic cells with an adhesive as disclosed by Duchateau et al., U.S. Pat. No. 4,331,494 to or an acrylic polymer pottant and weather resistant layer as disclosed in Gupta et al., U.S. Pat. No. 4,374,955 to Photovoltaic modules also have been encapsulated by acrylic prepolymers that are cast on the photovoltaic cells and cured to form an encapsulant as disclosed by Avenel et al., U.S. Pat. No. 4,549,033.

A photovoltaic module may also be encapsulated by laminating a layer of Tedlar® (manufactured and available from E.I. DuPont de Nemours & Co. of Wilmington, Del.) to the exposed side of the photovoltaic cells with a layer of ethyl vinyl acetate (EVA) (designated herein as "EVA lamination"). Another conventional encapsulant is a coating on the exposed side of the photovoltaic cells of ultraviolet (UV) curable urethane (designated herein as "UV urethane").

While each of these prior art techniques encapsulate a photovoltaic module, they do not provide adequate protection against degradation of the photovoltaic cells by corrosion caused by potentially harmful ambient conditions, in particular when a photovoltaic cell module is used outdoors. Further, the prior art techniques encapsulate a photovoltaic module at high cost due to a combination of expensive encapsulating materials, equipment, and labor.

In addition, prior art photovoltaic modules typically utilized two narrow isolation scribes around the perimeter of the photovoltaic module. Such an arrangement suffers from problems of buildup of particulates in the scribe lines with resultant loss of effectiveness of the scribes. Moreover, it is difficult and costly to produce photovoltaic modules with narrow isolation scribes.

It has been proposed in Application Serial No. 07/251,581 to dispose a layer of adhesive tape onto a photovoltaic cell to encapsulate the cell.

Summary of the Invention

The present invention overcomes the problems and disadvantages of the prior art by providing a photovoltaic module encapsulant that is inexpensive, is easily applied and provides superior protection against potentially harmful ambient conditions. Further, the photovoltaic module of the invention preferably includes an isolation scribe that is easy to fabricate and provides protection against environmental contaminants.

Additional objects and advantages of the invention will be set forth in part in the description that follows, and in part will be obvious from the description, or may be learned by practice of the invention. The objects and advantages of the invention may be realized and attained by means of the instrumentalities and combinations particularly pointed out in the appended claims.

To achieve the objects and in accordance with the purpose of the invention, as embodied and broadly described herein, the present invention provides a method of encapsulating a photovoltaic module. The photovoltaic module to be encapsulated has an exposed surface and includes a superstrate and one or more photovoltaic cells disposed on the superstrate.

The method of the present invention includes the steps of mixing a two component fluorinated polyurethane material with 3-glycidoxy propyltrimethoxy silane, applying the mixture onto the exposed surface of the photovoltaic module, heating the photovoltaic module at a first temperature for a time sufficient to dry the mixture and heating the photovoltaic module at a second temperature for a time sufficient to cure the mixture.

The coating material of the present invention is preferably applied by spraying onto the exposed surface of the module. After application, the coating may be dried at a temperature ranging from 50° to 90° C. and then may be cured at a temperature preferably ranging from 80° to 150° C. and more preferably at a temperature ranging from 90° to 130° C. The coating thickness preferably ranges from 1.0 to 3.0 mils dry film thickness and more preferably ranges from 1.8 to 2.2 mils dry film thickness.

The coating material of the invention may be applied in a single layer, or alternatively, may be applied in two or more layers.

Also in accordance with the present invention an encapsulated photovoltaic module is provided that includes a superstrate and one or more photovoltaic cells disposed thereon. The one or more photovoltaic cells has an exposed surface. The exposed surface of the one or more photovoltaic cells contains a two component barrier coating. This barrier coating comprises the reaction product of a fluorinated polyurethane material mixed together with 3-glycidoxypropyltrimethoxy silane.

The barrier coating mixture may also contain a solvent such as methyl ethyl ketone. The amount of the 3-glycidoxypropyltrimethoxy silane in the barrier coating mixture preferably ranges from 1.0% to 2.0% by weight.

The photovoltaic module also preferably includes an isolation scribe located around the perimeter of the module. The isolation scribe is preferably 5-8 microns in width.

Brief Description of the Drawings

The accompanying drawings, which are incorporated in and constitute a part of this specification, illustrate one embodiment of the invention and, together with the description, serve to explain the principles of the invention.

Description of the Preferred Embodiments

Reference will now be made in detail to the present preferred embodiments of the invention, examples of which are illustrated in the accompanying drawings.

Figure 1A:
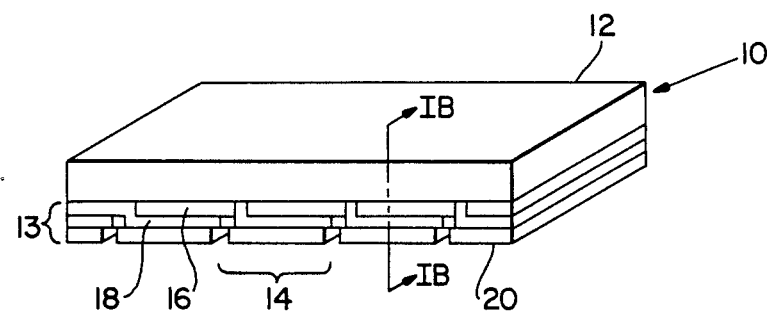
FIG. 1A is a perspective view of a photovoltaic module useful in the present invention.
Figure 1B:
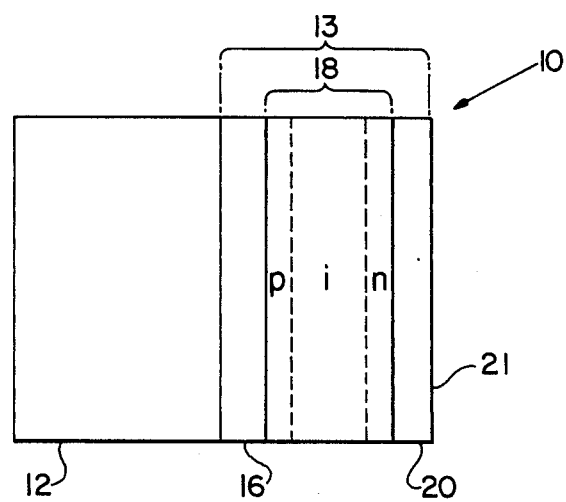
FIG. 1B is a cross-sectional view taken along sectional line IB-IB of the photovoltaic module of FIG. 1A.

In accordance with the present invention, a method is provided for encapsulating a photovoltaic module. The photovoltaic module includes a superstrate and one or more photovoltaic cells. As shown in Figs. 1A and 1B, and designated generally by the numeral 10, a conventional photovoltaic module is provided that includes, a superstrate 12 of, for example glass, and a photovoltaic cell assembly 13 that includes one or more photovoltaic cells 14 connected in series. Photovoltaic cell assembly 13 is referred to herein as "cell assembly 13". As an example, photovoltaic module 10 of FIG. 1A shows four individual photovoltaic cells 14 connected in series on superstrate 12. As more clearly shown in FIG. 1B, cell assembly 13 is fabricated on superstrate 12 by depositing a first conductor 16 of, for example, tin oxide ($S_nO_2$), a layer 18 of amorphous silicon and a second or back contact layer 20 of, for example, aluminum. In the absence of a covering or encapsulating material, a surface 21 of back contact layer 20 is exposed to ambient conditions. Surface 21 is referred to herein as the "exposed surface of the photovoltaic module" or simply the "exposed surface."

Figure 2A:
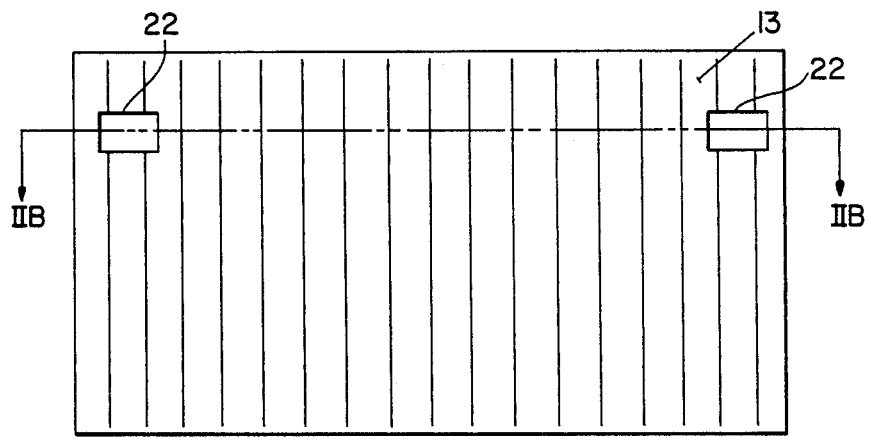
FIG. 2A is a plan view of a photovoltaic module useful in the present invention including insulating pads disposed thereon.
Figure 2B:
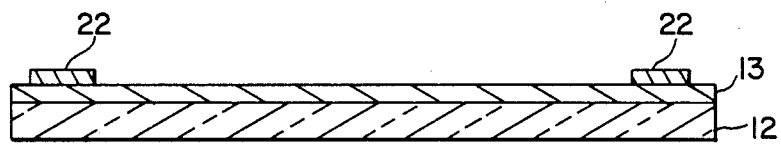
FIG. 2B is a side-sectional view of the photovoltaic module of FIG. 2A.

For simplicity of illustration, the individual layers in cell assembly 13 are not shown in FIGS. 2A-2B but it is to be understood that cell assembly 13 does include such layers as previously described.

As indicated in reference to Figs. 1A and 1B, the photovoltaic cells of each photovoltaic module are connected in series. Accordingly, to make use of such a photovoltaic module a connection must be formed to each end of the series of photovoltaic cells in a module. Thus, as shown in FIGS. 2A and 2B, insulation pads 22 are disposed on cell assembly 13. Insulation pads 22 preferably include a silver frit buss bar which enables an electrical connection to be formed at each end of a photovoltaic module.

In order to protect the photovoltaic module from galvanic corrosion when utilized in an outdoor environment and exposed to typical outdoor stresses such as moisture and acid rain, the present invention provides a spray encapsulant for application to the exposed surface of the photovoltaic module.

Figure 3:
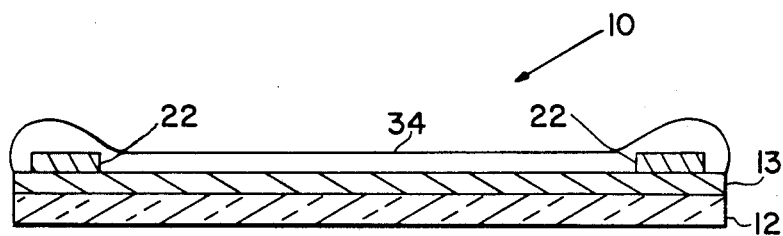
FIG. 3 is a side-sectional view of the photovoltaic module of FIG. 2B including an encapsulant or barrier coating layer.

FIG. 3 illustrates a photovoltaic module 10 including a spray encapsulant or barrier coating 34 applied to the exposed surface of the module.

In accordance with the present invention, a mixture of a two component fluorinated polyurethane with 3-glycidoxy propyltrimethoxy silane can be applied to the exposed surface of the one or more photovoltaic cells. The two component fluorinated polyurethane is preferably CPU 66/3 (available from KRC Research Corp., Moorestown, N.J.) which is 5:1 mixture of (A) a fluorinated polyester/alkyd and ethyl glycol acetate and (B) a coreactant which is 1,6-hexamethylene diisocyanate prepolymer. The 3-glycidoxy propyltrimethoxy silane is preferably coupling agent Z-6040 (available from Dow Corning, Midland, MI).

The encapsulant of the invention comprising a mixture of a two component fluorinated polyurethane with 3-glycidoxy propyltrimethoxy silane also functions to protect the photovoltaic module from mechanisms other than galvanic corrosion. The encapsulant can protect the module from acid rain which is capable, by the action of HCl, of etching back contact layer 20 of the photovoltaic module. In addition, the encapsulant of the invention can protect the module from scratches and other harmful abrasions.

The encapsulant of the invention is preferably sprayed onto the photovoltaic module by use of, for example, an air type spray gun. A stationary hand-type gun or an automated spraying system may be utilized. The preferred amount of 3-glycidoxy propyltrimethoxy silane in the mixture ranges from 1.0% to 2.0% by weight. The mixture may also include a solvent, such as methyl ethyl ketone. The mixture may be applied in a single layer or may be applied in two or more layers. After application of a coating layer of encapsulant, the layer may be heated to a temperature preferably ranging from 50° to 90° C. to dry the layer. If utilizing a hand-type sprayer, the drying step may range from 10 to 30 minutes, whereas due to increased efficiency, a shorter period will be sufficient when utilizing an automated system. The coating layer can then be heated to a temperature preferably ranging from 80° to 150° C. and more preferably to a temperature ranging from 90° to 130° C. to cure the layer. The curing step may range from 10 to 30 minutes for a hand sprayer and less for an automated sprayer. The final dry film thickness of the encapsulant layer preferably ranges from 1.0 to 3.0 mils and more preferably ranges from 1.8 to 2.2 mils.

The mechanism of curing is believed to consist of the silane compound crosslinking with the fluorinated polyurethane compound. In order to achieve effective crosslinking, it is important that (a) chemically reactive groups be available in the polymer to react with the silane compound, (b) the type of reactivity in the polymer be matched with the silane functional groups, (c) the silane rate of reactivity be similar to that of the polymer, and (d) the silane retain sufficient mobility until cure, so that it is free to migrate to the exposed surface of the photovoltaic module. In turn, the silane compound bonds with the aluminum of the exposed surface of the photovoltaic module. Presumably, the aluminum of the exposed surface of the photovoltaic module is hydrated, i.e., is characterized by the presence of hydroxyl groups at the surface, and the silane compound is believed to react with these AlOH surface groups.

In accordance with the invention, the encapsulant may be applied to the photovoltaic module prior to attachment of electrical connections to insulation pads 22. If this is the case, a maskant may be applied to insulation pads 22 to protect them from the barrier coating or the coating may be removed around insulation pads 22 prior to attachment of the electrical connections. Alternatively, the electrical connections may be attached to insulation pads 22 and masked prior to application of the encapsulant.

Figure 4A:
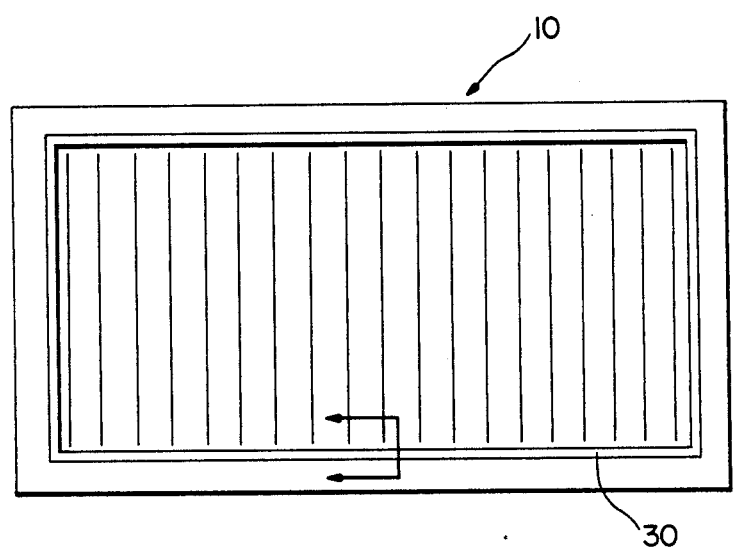
FIG. 4A is a top view of the photovoltaic module of FIG. 1A including an isolation scribe in the back contact layer around the perimeter of the module.
Figure 4B:
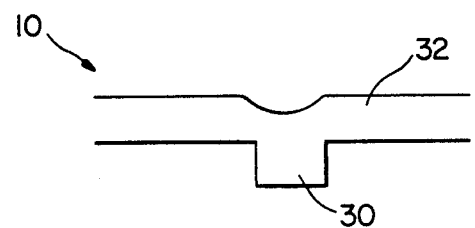
FIG. 4B is a side-sectional view of the photovoltaic module of FIG. 4A.

In accordance with another aspect of the invention, as shown by FIGS. 4A and 4B, an isolation scribe 30 is preferably located around the perimeter of back contact layer 20 of photovoltaic module 10. The purpose of isolation scribe 30 is to coact with the encapsulant 32 to further protect the module from acid rain, moisture and other contaminants to prevent galvanic corrosion. The encapsulant that is disposed in scribe 30 acts as a wall or a barrier to the propagation of moisture or other contaminants in a direction parallel to the exposed surface of the photovoltaic module. The encapsulant of the invention has a high dielectric strength which, because of the direct correlation between isolation scribe width and the electrical breakdown voltage of the module, enables a wide isolation scribe 30 to be utilized while still achieving the desired breakdown voltage. Therefore, isolation scribe 30 can be made wider than those scribes of the prior art without resulting breakdown voltage problems. Prior art isolation scribes usually range from 1-2 mils in width. Isolation scribe 30 preferably has a width ranging from 5 to 8 mils. The wider scribe provides a greater barrier against moisture, is more easily cleaned and is easier to fabricate than the narrower scribes typically utilized by the prior art. The combination of the wider isolation scribe and the application of an encapsulant barrier coating acts to effectively protect the photovoltaic module from galvanic corrosion caused by ambient conditions.

The following example is provided to illustrate the present invention and some of its advantages. The example is not to be considered as limiting the present invention.

EXAMPLE 1

Sixteen modules were coated with a barrier coating containing 1% by weight of 3-glycidoxy-propyltrimethoxy silane mixed with CPU 66/3 which is a two-component fluorinated polyurethane material available from KRC Research Corp., Moorestown, N.J. The coating was applied in a single layer by utilizing an Integrated Technologies Automated Spraying System utilizing eight (8) respirating guns. The coating layer was applied to a thickness of 4 mils wet. The modules were then placed on a conveyor belt and transported through an oven consisting of an initial flash zone (five feet long) followed by five heating zones (each two feet in length). The entire oven length was 15 feet. The temperatures in heating zones 1-5 were 50° C., 75° C., 100° C., 100° C. and 120° C., respectively. The modules were conveyed through the oven at a rate of 1 foot/minute. The final dry film thickness of the coating layer was 2.0 mils.

The coated modules underwent several different environmental tests. All 16 had wide (5-8 mils) isolation scribes and wires soldered to them with hot melt over the solder joints. The 16 modules were divided into 3 groups. Group 1 underwent thermal cycle and humidity freeze tests. Group 2 underwent a water immersion test and group 3 underwent humidity soak and wet isolation tests.

The results were as follows:

Group 1

The thermal cycle (T.C.) testing was conducted in an environmental enclosure which maintains a dry temperature cycle of +90° C. to −40° C.; 4 cycles a day with a 45-minute transition period between cycles. The test was run for 12.5 days.

The humidity freeze (H.F.) testing was conducted in an environmental enclosure which maintained 85% humidity throughout the test. The temperature cycle was +85° C. for 20 hours to −40° C. for 1-2 hours. The test ran for 10 days.

|  | VOLTAGE | AVERAGE Pm (volts) |
| --- | --- | --- |
| Initial | 11.77 | 2.45 |
| After T.C. | 11.93 | 2.60 |
| After H.F. | 11.90 | 2.63 |

(Pm=maximum power)
The modules did not degrade as a result of this testing.

Group 2

Water immersion was conducted by immersing the modules in water heated to 50° C. for 5 days with an ELH lamp. The ELH lamp is manufactured by and available from GTE Sylvania Products Corp. of Salem, Mass. The modules were electrically tested after testing for degradation.

The effects of water testing were as follows:

|  | AVERAGE | $\alpha$ | (standard) (deviation) | Pm AVG | $\alpha$ |
| --- | --- | --- | --- | --- | --- |
| Initial Voltage | 11.09 | .44 |  | 2.12 | .08 |
| After W.I. | 11.47 | .20 |  | 2.16 | .16 |

Water Immersion had essentially no effect on the modules.

Group 3

Humidity soak testing was conducted in an environmental enclosure with a humidity of 85% and a temperature of 85° C. The test was 30 days long.

|  | AVERAGE | $\alpha$ | Pm | $\alpha$ |
| --- | --- | --- | --- | --- |
| Initial Voltage | 11.45 | .29 | 2.35 | .15 |

The Humidity Soak test had essentially no effect on the modules.

Wet Isolation Testing

All modules were tested using the SERI Hi-pot test procedure. The modules were fully submersed for one hour in a tub of tap water containing Alconox surfactant at 25° C. They were tested for electrical leakage for 60 sec. at 500 volts.

The modules leaked at 0.020 to 0.030 mA. (The modules fail if the leak is 0.040 mA or more).

Other tests where water immersion was done for longer periods of time prove that modules prepared according to the invention will last for 21 to 28 days on the average without a significant loss in power.

It will be apparent to those skilled in the art that various modifications and variations can be made in the encapsulated photovoltaic module of the present invention without departing from the scope or spirit of the invention. Thus, it is intended that the present invention cover the modifications and variations of this invention provided they come within the scope of the appended claims and their equivalents.

What is claimed is:

1. A method for encapsulating a photovoltaic module having an exposed surface, said photovoltaic module including a superstrate and one or more photovoltaic cells disposed on said superstrate, said method comprising the steps of:
    forming a mixture comprising a two component fluorinated polyurethane with 3-glycidoxy-propyl-trimethoxy silane;
    applying said mixture onto said exposed surface of the photovoltaic module;
    heating said photovoltaic module at a first temperature for a period sufficient to dry said mixture; and
    heating said photovoltaic module at a second temperature for a period sufficient to cure said mixture.

2. The method of claim 1, wherein said mixture is applied onto said exposed surface of the photovoltaic module by spraying.

3. The method of claim 1, wherein the amount of said 3-glycidoxy-propyltrimethoxy silane in said mixture ranges from 1.0 % to 2.0% by weight.

4. The method of claim 1, wherein said mixture further comprises a solvent.

5. The method of claim 4, wherein said solvent comprises methyl ethyl ketone.

6. The method of claim 1, wherein said mixture is applied to said exposed surface of the photovoltaic module in a single layer.

7. The method of claim 1, wherein said mixture is applied to said exposed surface of the photovoltaic module in a plurality of layers.

8. The method of claim 1, wherein said first temperature ranges from 50° to 90° C.

9. The method of claim 1, wherein said second temperature ranges from 90° to 130° C.

10. An encapsulated photovoltaic module comprising:
    a superstrate and one or more photovoltaic cells having an exposed surface disposed on said superstrate; and
    a barrier coating applied to said exposed surface of the one or more photovoltaic cells, said barrier coating comprising the reaction product of a mixture comprising a two component fluorinated polyurethane and 3-glycidoxypropyltrimethoxy silane.

11. The encapsulated photovoltaic module of claim 10, wherein said barrier coating has a dry film thickness ranging from 1.0 to 3.0 mils.

12. The encapsulated photovoltaic module of claim 10, wherein the amount of said 3-glycidoxy-propyltrimethoxy silane in said mixture ranges from 1.0 % to 2.0%, by weight.

13. The encapsulated photovoltaic module of claim 10, further comprising an isolation scribe located around the perimeter of said exposed surface of the photovoltaic module.

14. The encapsulated photovoltaic module of claim 13, wherein said isolation scribe has a width ranging from 5 to 8 mils.

* * * * *